United States Patent [19]

Nishioka et al.

[11] 4,455,330

[45] Jun. 19, 1984

[54] METHOD OF INCREASING INSULATION RESISTANCE OF GLASS FIBERS

[75] Inventors: Gary M. Nishioka, Pataskala; Sheldon P. Wesson, Granville, both of Ohio

[73] Assignee: Owens-Corning Fiberglas Corporation, Toledo, Ohio

[21] Appl. No.: 405,119

[22] Filed: Aug. 4, 1982

[51] Int. Cl.³ .................. B05D 3/02; B32B 7/00; B32B 17/02

[52] U.S. Cl. .................. 427/379; 427/384; 427/389.8; 428/268; 428/429; 556/482

[58] Field of Search ............. 427/384, 389.8, 379; 428/429, 441, 442, 268; 556/482

[56] References Cited

U.S. PATENT DOCUMENTS 2,649,396 8/1953 Witt et al. .................. 556/482 X
3,350,345 10/1967 Vanderbilt et al. ........... 428/429 X
3,454,454 7/1969 Sterman et al. .............. 428/429 X

FOREIGN PATENT DOCUMENTS 775066 10/1980 U.S.S.R. .................. 428/429

OTHER PUBLICATIONS

Riedo et al., Chemically Modified Silicon Dioxide Surfaces, *Helvetica Chimica Acta*, 61, 912 (1978).
Kadotani, Electrical Properties of the Glass/Epoxy Interface, *Composites*, Oct. 1980.
Buzek et al., Stoichiometry And Kinetics of the Reaction of Silica With Organosilicon Compounds, *J. Colloidal & Interface Science*, 79, 47 (1981).
Yang et al., The Formation of Current Leakage Paths by Diffusion of Water Through Protective Coatings, *Ind. Eng. Chem., Prod. Res. Dev.*, 16, 252 (1977).
Wiedemann, Fiber Glass Specific Problems in Composite Formation for Electronic Laminates, Vorabdruck--Oeff. Jahrestag. Arbeitsgem, Verstaerkte Kunstst 15:10-1-10-10, 1978.
Arkles, Tailoring Surfaces with Silanes, *Chemtech*, p. 766, 1977.
Plueddemann, Use of Silane and Other Coupling Agents as Adhesion Promoters, (sic), from manuscript of book "Silane Coupling Agents" to be published late 1981 by Plenum.
Vaughan, Studies at the Glass Fiber-Resin Interface, Printed Circuit World Expo '80 Proceedings, p. 25.
Huneke et al., Relaxation Phenomena of Epoxy Resin on Inorganic Substrates, Proceedings of the Tenth NATAS Conference, Oct. 26–29, 1980, pp. 175–178.

*Primary Examiner*—Michael R. Lusignan
*Attorney, Agent, or Firm*—Ronald C. Hudgens; Philip R. Cloutier

[57] ABSTRACT

The insulation resistance of glass fibers is improved by contacting the glass fibers with monofunctional silanes such as phenyldimethylethoxysilane.

5 Claims, 2 Drawing Figures

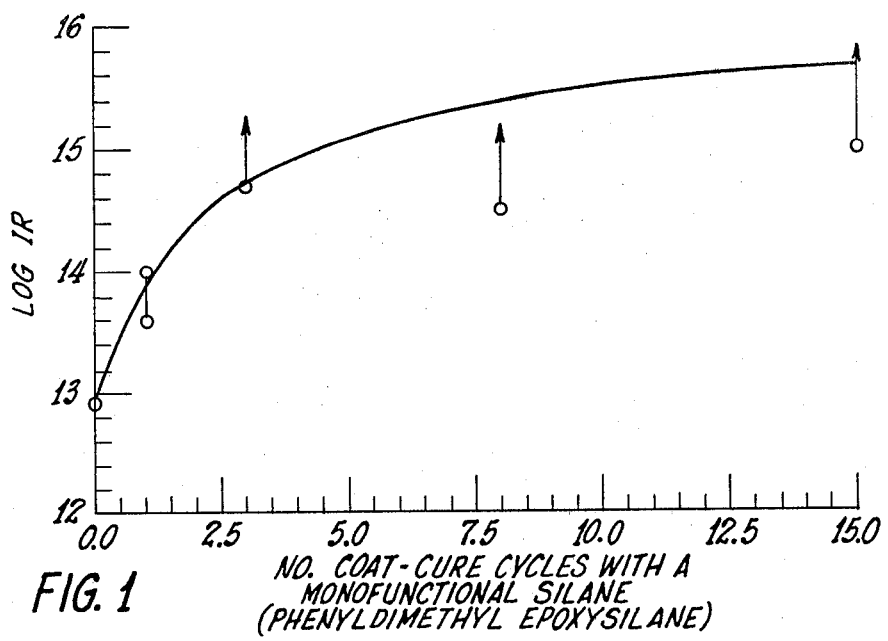
FIG. 1 NO. COAT-CURE CYCLES WITH A MONOFUNCTIONAL SILANE (PHENYLDIMETHYL EPOXYSILANE)
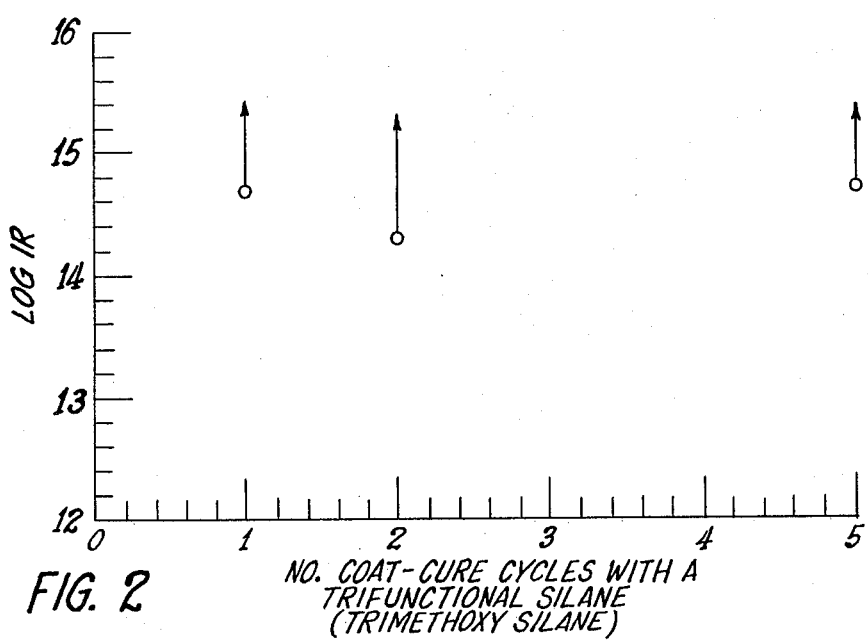
FIG. 2 NO. COAT-CURE CYCLES WITH A TRIFUNCTIONAL SILANE (TRIMETHOXY SILANE)

METHOD OF INCREASING INSULATION RESISTANCE OF GLASS FIBERS

TECHNICAL FIELD

This invention relates to a method of increasing insulation resistance of glass fiber.

In one of its more specific aspects, this invention relates to a method of increasing insulation resistance of glass fibers which are woven into cloth and used as fillers in epoxy circuit board laminates.

BACKGROUND OF THE INVENTION

Glass yarn, produced from glass fibers, is woven into cloth and used as filler in various types of circuit board polymeric laminates. The insulation resistance (IR) of these laminates is measured before and after soaking in distilled water at 50° C. for 48 hours. IR degradation has been found to vary from glass batch to glass batch and presents a serious problem in circuit board manufacture.

The method of this invention is directed towards the solution of that problem, as well as towards increasing the IR of glass fibers.

STATEMENT OF THE INVENTION

According to this invention, there is provided a method for improving the insulation resistance of glass fibers which comprises contacting the glass fibers with a monofunctional silane for a period sufficient to react the monofunctional silane with the reactive sites on the glass. By "reactive sites on the glass" is meant glass surface hydroxyl groups, or any other groups reactive with the silanes.

In one embodiment of the invention, after the contact, the glass fibers are treated to remove unreacted silanes and dimers formed during the contact.

In another embodiment of the invention, the glass fibers are contacted with the monofunctional silanes in a plurality of steps.

DESCRIPTION OF DRAWINGS

FIG. 1 is a depiction of the correlation of log IR and the number of coat-cure cycles of glass fibers with a monofunctional silane.

FIG. 2 is a depiction of the correlation of log IR and the number of coat-cure cycles of glass fibers with a tri-functional silane.

DESCRIPTION OF THE INVENTION

The method of this invention is applicable to any glass fibers, either individually, or in the form of rovings or cloth whether or not embedded in a polymeric laminate.

The method of this invention is applicable to any method of contact between the glass fibers and the silanes. One preferred method involves dipping the glass fibers in the silanes for a period up to about 1 minute. Any number of such contacts can be employed.

The method of this invention is applicable to the use of any monofunctioal silanes. Among those which can be employed are trimethylethoxysilane and phenyldimehthyl ethoxysilane, the latter being preferred.

A typical method of carrying out the invention is illustrated by the following.

A 0.1M solution of a monofunctional silane was dissolved in a 95% methanol in water solution. The resulting solution was adjusted to a pH of 5 with glacial acetic acid.

Swatches of heat cleaned cloth weighing several grams were dipped for 10 seconds in the solution. The cloths were then hung in an over at 160°–165° C. for five minutes. The cloths were then either redipped in the silane solution and cured again or placed in a Soxhlet extractor.

Samples of cloth were subjected to different amounts of coat-cure treatments in order to vary the extent of reaction of the glass surface with the silane. Following the coat-cure step, the cloth was washed with petroleum ether C in a Soxhlet extractor for 48 hours. After Soxhlet extraction, the cloth was dried in a dessicator for several days.

IR values of coupons produced from glass cloths with different degrees of reaction of the glass with silanes were then determined. The results of treating glass cloths with phenyldimethyl-ethoxysilane is shown in FIG. 1, which relates log IR with the number of coat-cure cycles. A definite improvement in IR with the number of treatments is indicated.

It is well known in the art to include, as a component of glass sizes, tri-functional silanes, such as trimethoxysilanes. Accordingly, comparable treatments to those made with monofunctional silanes were made employing trimethoxy silane. The results are depicted in FIG. 2.

From a comparison of these data, it is evident that the treatment with the monofunctional silanes shows superior results where from 4 to about 15 coating-curing cycles are employed.

In summation, according to this invention, it has been shown that as the number of reacted silanes (number of coatings and curing cycles) bonded to the glass surface increases, the IR of the resulting glass increase from about $10+^{13}$ to greater than $10+^{15}$ ohms. It is estimated that glass fibers completely reacted on their surfaces with monofunctional silanes will possess an IR of about at least about $10+^{15}$ ohms and as high as about $10+^{17}$ ohms when treated with from about 4 to about 15 contacts and accompanying curing cycles.

It will be evident from the foregoing that various modifications can be made to this invention. Such, however, are considered within the scope of the invention.

We claim:

1. A method of improving the insulation resistance of glass fibers which comprises contacting the glass fibers with phenyldimethyl athoxysilane for a period sufficient to react said silane with at least some of the hydroxyl groups on the surface of the glass fibers.

2. The method of claim 1 in which said glass is contacted with a 0.1M solution of said phenyldimethyl ethoxysilane dissolved in a 95% methanol in water solution.

3. The method of claim 1 in which the insulation resistance of said glass is increased from about $10+^{13}$ ohms to greater than $10+^{15}$ ohms.

4. The method of claim 1 in which said glass is contacted with said silane and cured from about 4 to about 15 times.

5. The method of claim 1 in which the insulation resistance of said glass is increased to about $10+^{17}$ ohms.

* * * * *